US010023827B2

(12) United States Patent
Mochida et al.

(10) Patent No.: US 10,023,827 B2
(45) Date of Patent: Jul. 17, 2018

(54) CLEANING COMPOSITION FOR SEMICONDUCTOR SUBSTRATE AND CLEANING METHOD

(71) Applicant: JSR CORPORATION, Tokyo (JP)

(72) Inventors: Kenji Mochida, Tokyo (JP); Motoyuki Shima, Tokyo (JP)

(73) Assignee: JSR CORPORATION, Tokyo (JP)

(*) Notice: Subject to any disclaimer, the term of this patent is extended or adjusted under 35 U.S.C. 154(b) by 0 days.

(21) Appl. No.: 15/590,326

(22) Filed: May 9, 2017

(65) Prior Publication Data

US 2017/0240851 A1 Aug. 24, 2017

Related U.S. Application Data

(62) Division of application No. 14/810,981, filed on Jul. 28, 2015.

(30) Foreign Application Priority Data

Jul. 31, 2014 (JP) .................................. 2014-157071

(51) Int. Cl.
*C11D 11/00* (2006.01)
*C11D 3/37* (2006.01)
(Continued)

(52) U.S. Cl.
CPC ........ *C11D 11/0047* (2013.01); *B08B 7/0014* (2013.01); *C08F 120/18* (2013.01);
(Continued)

(58) Field of Classification Search
CPC ... C11D 11/00; C11D 11/0047; C08F 120/18; B08B 7/0014
See application file for complete search history.

(56) References Cited

U.S. PATENT DOCUMENTS 4,786,658 A * 11/1988 Hashimoto ........... C03C 25/105
385/145
5,782,962 A * 7/1998 Burke ..................... C09G 1/10
106/10
(Continued)

FOREIGN PATENT DOCUMENTS

CN 102533171 B 2/2015
JP 07-074137 A 3/1995
(Continued)

OTHER PUBLICATIONS

Office Action dated Jan. 9, 2018 in Japanese Patent Application No. 2014-157071 (with English language translation).
(Continued)

*Primary Examiner* — Nicole M Buie-Hatcher
*Assistant Examiner* — M. Reza Asdjodi
(74) *Attorney, Agent, or Firm* — Oblon, McClelland, Maier & Neustadt, L.L.P.

(57) ABSTRACT

A cleaning composition for a semiconductor substrate contains a solvent, and a polymer that includes a fluorine atom, a silicon atom or a combination thereof. The content of water in the solvent is preferably no greater than 20% by mass. The cleaning composition preferably further contains an organic acid which is a non-polymeric acid. The organic acid is preferably a polyhydric carboxylic acid. The acid dissociation constant of the polymer is preferably less than that of the organic acid. The solubility of the organic acid in water at 25° C. is preferably no less than 5% by mass. The organic acid is preferably a solid at 25° C.

17 Claims, 3 Drawing Sheets

(51) Int. Cl.

| | |
|---|---|
| *C11D 7/50* | (2006.01) |
| *B08B 7/00* | (2006.01) |
| *C08F 120/18* | (2006.01) |
| *C08F 120/24* | (2006.01) |
| *C08F 120/28* | (2006.01) |
| *C08F 132/08* | (2006.01) |
| *C08K 5/092* | (2006.01) |
| *C11D 3/20* | (2006.01) |
| *C11D 3/24* | (2006.01) |
| *C11D 3/43* | (2006.01) |
| *H01L 21/02* | (2006.01) |

(52) U.S. Cl.
CPC .......... *C08F 120/24* (2013.01); *C08F 120/28* (2013.01); *C08F 132/08* (2013.01); *C08K 5/092* (2013.01); *C11D 3/2086* (2013.01); *C11D 3/245* (2013.01); *C11D 3/373* (2013.01); *C11D 3/43* (2013.01); *C11D 7/50* (2013.01); *C11D 11/0058* (2013.01); *H01L 21/02052* (2013.01)

(56) References Cited

U.S. PATENT DOCUMENTS

| | | | | |
|---|---|---|---|---|
| 6,436,832 | B1 | 8/2002 | Ma | |
| 6,641,463 | B1 * | 11/2003 | Molnar | B24B 37/042 |
| | | | | 451/285 |
| 8,697,344 | B2 * | 4/2014 | Kouno | G03F 7/2041 |
| | | | | 430/273.1 |
| 9,334,470 | B2 * | 5/2016 | Taniguchi | C11D 7/3209 |
| 2006/0029808 | A1 | 2/2006 | Zhai | |
| 2010/0240563 | A1 | 9/2010 | Jaynes | |
| 2013/0116159 | A1 * | 5/2013 | Pollard | C11D 1/72 |
| | | | | 510/176 |
| 2013/0143785 | A1 * | 6/2013 | Taniguchi | C11D 7/3209 |
| | | | | 510/175 |
| 2015/0064625 | A1 | 3/2015 | Ogihara | |
| 2015/0228498 | A1 | 8/2015 | Hattori | |
| 2016/0032227 | A1 * | 2/2016 | Mochida | C11D 3/373 |
| | | | | 510/175 |

FOREIGN PATENT DOCUMENTS

| | | | | |
|---|---|---|---|---|
| JP | 9-59679 A | | 3/1997 | |
| JP | 11-217584 A | | 8/1999 | |
| JP | 2005-179687 A | | 7/2005 | |
| JP | 2005179687 A | * | 7/2005 | |
| JP | 2010-258014 A | | 11/2010 | |
| JP | 2012-58273 A | | 3/2012 | |
| JP | 2014-099583 A | | 5/2014 | |
| WO | WO 2007095101 A2 | * | 8/2007 | ............ C11D 3/2082 |
| WO | WO 2014/097309 A1 | | 6/2014 | |

OTHER PUBLICATIONS

Japanese Office Action dated Sep. 26, 2017 in Patent Application No. 2014-157071 (with English Translation).
JP 2005-179687 Machine Translation.

* cited by examiner

CLEANING COMPOSITION FOR SEMICONDUCTOR SUBSTRATE AND CLEANING METHOD

CROSS-REFERENCE TO RELATED APPLICATIONS

The present application is a divisional application of U.S. patent application Ser. No. 14/810,981 filed Jul. 28, 2015, which claims priority to Japanese Patent Application No. 2014-157071, filed Jul. 31, 2014. The contents of these applications are incorporated herein by reference in their entirety.

BACKGROUND OF THE INVENTION

Field of the Invention

The present invention relates to a cleaning composition for a semiconductor substrate and a cleaning method.

Discussion of the Background

In production processes of semiconductor substrates, cleaning is conducted in order to remove contaminants such as particles attached onto the surface of the substrates having a pattern formed thereon. In recent years, miniaturization of the formed pattern, and an increase of the aspect ratio have advanced. In cleaning through using a liquid and/or gas, it is difficult to achieve the flow of the liquid and/or gas between the pattern walls in the vicinity of a substrate surface, thereby making removal of fine particles and/or the attached particles between the pattern walls difficult.

Japanese Unexamined Patent Application, Publication No. H7-74137 discloses a method in which after feeding a coating liquid on a substrate surface to provide a thin film, detachment with an adhesive tape removes particles on the substrate surface. According to this method, fine particles and the particles between pattern walls can be reportedly removed at a high removal rate while influences on the semiconductor substrate are decreased.

Japanese Unexamined Patent Application, Publication No. 2014-99583 discloses an apparatus for cleaning a substrate, and a cleaning method for a substrate, in which a treatment liquid for forming a film on a substrate surface is supplied and solidified or hardened, and then the entire treatment liquid solidified or hardened is dissolved in a removing liquid to remove particles on the substrate surface. Although the detailed description of the invention discloses a top coating liquid as a non-limiting example of the treatment liquid, a detailed description as to which treatment liquid is suited is not found.

SUMMARY OF THE INVENTION

According to one aspect of the present invention, a cleaning composition for a semiconductor substrate includes a solvent, and a polymer including a fluorine atom, a silicon atom or a combination thereof.

According to another aspect of the present invention, a cleaning method includes coating a cleaning composition on a surface of a semiconductor substrate to form a film. The cleaning composition includes a solvent and a polymer which includes a fluorine atom, a silicon atom or a combination thereof. The film is removed from the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
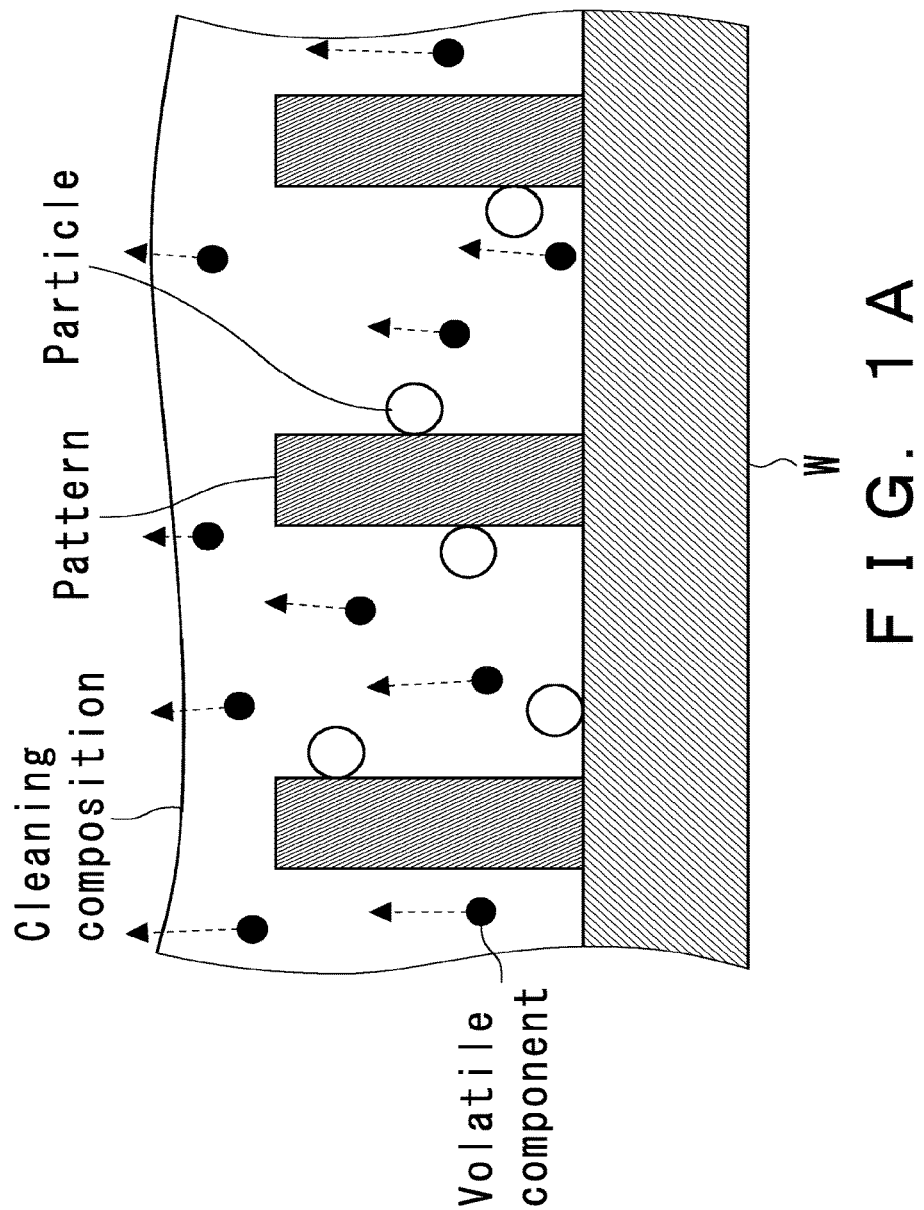
FIG. 1A shows an explanatory view illustrating a cleaning method for a semiconductor substrate carried out using a cleaning composition for a semiconductor substrate of an embodiment of the present invention.

According to an embodiment of the invention made for solving the aforementioned problems, a cleaning composition for a semiconductor substrate contains a solvent (hereinafter, may be also referred to as "(A) solvent" or "solvent (A)"), and a polymer that includes a fluorine atom, a silicon atom or a combination thereof (hereinafter, may be also referred to as "(B) polymer" or "polymer (B)").

According to the embodiment of the present invention, for use in a process of removing unwanted substances on a substrate surface through forming a film on the substrate surface, a cleaning composition for a semiconductor substrate is provided which is capable of efficiently removing particles on the substrate surface, and enable the formed film to be easily removed from the substrate surface. The composition according to the embodiment of the present invention can be suitably used in manufacturing processes of semiconductor elements for which further progress of miniaturization, and an increase of the aspect ratio are expected in the future. Hereinafter, embodiments of the present invention are explained in detail.

Cleaning Composition for Semiconductor Substrate

The cleaning composition for a semiconductor substrate according to an embodiment of the present invention (hereinafter, may be also merely referred to as "cleaning composition") is a composition used for cleaning semiconductor substrates. A film is formed on the surface of a semiconductor substrate using the cleaning composition, and then particles attached to the surface of the substrate, particularly between pattern walls and the like can be efficiently removed by removing the film.

The cleaning composition contains the solvent (A), and the polymer (B). Since the polymer (B) includes a fluorine atom and/or a silicon atom, it is presumed that the cleaning composition exhibits proper wet spreadability on substrate surfaces, and the formed film has an affinity to the removing liquid and a proper rate of dissolution, thereby allowing the particles on the substrate surface to be rapidly removed in a state in which the particles are covered by the film, leading to an achievement of a high efficiency of removal.

The cleaning composition may further contain an organic acid not belonging to polymers (hereinafter, may be also merely referred to as "(C) organic acid" or "organic acid (C)"). The phrase "not belonging to polymers" as referred to means not having a repeating structure that is generated by a polymerization or condensation reaction. In other words, the organic acid (C) is a non-polymeric acid. When the cleaning composition contains the organic acid (C), removal of the film and particles from the substrate surface is further facilitated. For example, a longer time period of time may be necessary for removing films formed on the surface of silicon nitride substrates or titanium nitride substrates, as compared with films formed on the surfaces of a silicon substrate. By adding the organic acid (C), such a time period required for the removal can be shortened. Although the reasons for such an event are not clarified, it is presumed, for example, that one reason may involve appropriately decreased strength of the film formed on the substrate surface, as a result of dispersion of the organic acid (C) in the polymer (B) in the film. Consequently, removal of the coated film is believed to be further facilitated even in the case in which a substrate such as a silicon nitride substrate is employed that exhibits a strong interaction with the polymer (B).

Furthermore, the cleaning composition may contain in addition to components (A) to (C), other optional component(s) within a range not leading to impairment of the effects of the present invention.

Hereinafter, each component will be explained.

(A) Solvent

The solvent (A) for use in the composition may be any one as long as it can dissolve or disperse the polymer (B), and a solvent that can dissolve the polymer (B) is preferred. Also, when the organic acid (C) is added, the solvent preferably dissolves the organic acid (C).

The solvent (A) is exemplified by: an organic solvent such as an alcohol solvent, an ether solvent, a ketone solvent, an amide solvent, an ester solvent and a hydrocarbon solvent; water; and the like.

Examples of the alcohol solvent include: monohydric alcohols having 1 to 18 carbon atoms such as ethanol, isopropyl alcohol, amyl alcohol, 4-methyl-2-pentanol, cyclohexanol, 3,3,5-trimethylcyclohexanol, furfuryl alcohol, benzyl alcohol and diacetone alcohol; dihydric alcohols having 2 to 12 carbon atoms such as ethylene glycol, propylene glycol, diethylene glycol, dipropylene glycol, triethylene glycol and tripropylene glycol; and partial ethers of the same.

Examples of the ether solvent include: diallyl ether solvents such as diethyl ether, dipropyl ether, dibutyl ether and diisoamyl ether; cyclic ether solvents such as tetrahydrofuran and tetrahydropyran; aromatic ring-containing ether solvents such as diphenyl ether and anisole; and the like.

Examples of the ketone solvent include: chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethyl nonanone; cyclic ketone solvents such as cyclopentanone, cyclohexanone, cycloheptanone, cyclooctanone and methylcyclohexanone; 2,4-pentanedione; acetonylacetone; acetophenone; and the like.

Examples of the amide solvent include: cyclic amide solvents such as N,N'-dimethylimidazolidinone and N-methylpyrrolidone; chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include: monohydric alcohol carboxylate solvents such as ethyl acetate, butyl acetate, benzyl acetate, cyclohexyl acetate, ethyl lactate and ethyl 3-methoxypropionate; polyhydric alcohol partial ether carboxylate solvents such as monocarboxylates of an alkylene glycol monoalkyl ether, and monocarboxylates of a dialkylene glycol monoalkyl ether; cyclic ester solvents such as butyrolactone; carbonate solvents such as diethyl carbonate; polyhydric carboxylic acid alkyl ester solvents such as diethyl oxalate and diethyl phthalate.

Examples of the hydrocarbon solvent include: aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane; aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, the solvent (A) is preferably an organic solvent, more preferably an alcohol solvent, an ether solvent, a ketone solvent or an ester solvents, still more preferably a monohydric alcohol, a partial ether of a dihydric alcohol, a diallyl ether solvent, a cyclic ketone solvent, a monohydric alcohol carboxylate solvent, a cyclic ester solvent or a polyhydric alcohol partial ether carboxylate solvent, and even more preferably 4-methyl-2-pentanol, diisoamyl ether, propylene glycol monoethyl ether, ethyl lactate, methyl 3-methoxypropionate, butyrolactone or propylene glycol monomethyl ether acetate.

The percentage content of water in the solvent (A) is preferably no greater than 20% by mass, more preferably no greater than 5% by mass, still more preferably no greater than 2% by mass, and particularly preferably 0% by mass. When the percentage content of water in the solvent (A) is no greater than the upper limit, strength of the formed film can be more appropriately decreased, and as a result, a cleaning property by the cleaning composition can be improved.

The lower limit of the content of the solvent (A) is preferably 50% by mass, more preferably 80% by mass, and still more preferably 90% by mass. The upper limit of the content is preferably 99.9% by mass, more preferably 99.5% by mass, and still more preferably 99.0% by mass. When the content of the solvent (A) falls within the range of from the lower limit to the upper limit, the cleaning property of the cleaning composition on silicon nitride substrates can be further improved. The cleaning composition may contain either one, or two or more types of the solvent (A).

(B) Polymer

The polymer (B) includes a fluorine atom, a silicon atom or a combination thereof.

Although the type of the polymer (B) is not particularly limited, in light of ease in synthesis, and improvement of removability, the polymer (B) is preferably poly(meth)acrylate, a poly(cyclic olefin) or a polystyrene derivative.

The polymer (B) is exemplified by a polymer having a structural unit that includes a fluorine atom (hereinafter, may be also referred to as "structural unit (I)"), a polymer having a structural unit that includes a silicon atom (hereinafter, may be also referred to as "structural unit (II)"), and the like.

Examples of the structural unit (I) include structural units represented by the following formula (1-1) (hereinafter, may be also referred to as "structural unit (I-1)"), structural units represented by the following formula (1-2) (hereinafter, may be also referred to as "structural unit (I-2)"), and the like.

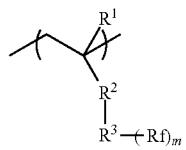

(1-1)

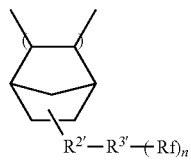

(1-2)

In the above formulae (1-1) and (1-2), Rfs each independently represent a monovalent fluorinated hydrocarbon group having 1 to 20 carbon atoms, which is hydroxy-substituted, alkylcarbonyl-substituted, alkoxycarbonyl-substituted, alkylcarbonyloxy-substituted, alkoxycarbonyloxy-substituted, or unsubstituted, and in a case in which Rf is present in a plurality of number, a plurality of Rfs may be identical or different.

In the above formula (1-1), $R^1$ represents a hydrogen atom, a fluorine atom, a methyl group or —COOR'; R' represents a monovalent hydrocarbon group having 1 to 20 carbon atoms; $R^2$ represents a single bond, —O—, —CO—, —COO— or —CONH—; $R^3$ represents an organic group having 1 to 20 carbon atoms and having a valency of (m+1); and m is an integer of 1 to 3, wherein in the case in which m is 1, $R^3$ may be a single bond.

In the above formula (1-2), $R^{2'}$ represents a single bond, —O—, —COO— or —CONH—; $R^{3'}$ represents an organic group having 1 to 20 carbon atoms and having a valency of (n+1); and n is an integer of 1 to 3, wherein in the case in which n is 1, $R^{3'}$ may be a single bond.

In light of the copolymerizability of the monomer that gives the structural unit (I-1), $R^1$ preferably represents a hydrogen atom or a methyl group, and more preferably a methyl group.

$R^2$ preferably represents a single bond or —COO—.

$R^{2'}$ preferably represents a single bond.

The organic group having 1 to 20 carbon atoms and having a valency of (m+1) represented by $R^3$, and the organic group having 1 to 20 carbon atoms and having a valency of (n+1) represented by $R^{3'}$ are exemplified by hydrocarbon groups having a valency of k and having 1 to 20 carbon atoms (wherein, k is (m+1) or (n+1)), (a) groups obtained from the hydrocarbon group having a valency of k and having 1 to 20 carbon atoms by incorporating a divalent hetero atom-containing group between adjacent two carbon atoms thereof, groups obtained from the hydrocarbon group having a valency of k and having 1 to 20 carbon atoms or the group (a) by substituting a part or all of hydrogen atoms included therein with a monovalent hetero atom-containing group, and the like.

Examples of the hydrocarbon group having a valency of k and having 1 to 20 carbon atoms include chain hydrocarbon groups having a valency of k and having 1 to 20 carbon atoms, alicyclic hydrocarbon groups having a valency of k and having 3 to 20 carbon atoms, aromatic hydrocarbon groups having a valency of k and having 6 to 20 carbon atoms, and the like.

Examples of the chain hydrocarbon group having a valency of k and having 1 to 20 carbon atoms include groups obtained by eliminating k hydrogen atoms from: alkanes such as methane, ethane, propane and butane; alkenes such as ethene, propene and butene; alkynes such as ethyne, propyne or butyne; or the like, and the like.

Examples of the alicyclic hydrocarbon group having a valency of k and having 3 to 20 carbon atoms include: groups obtained by eliminating k hydrogen atoms from cycloalkanes such as cyclopropane, cyclobutane, cyclopentane, cyclohexane, norbornane and adamantane; cycloalkenes such as cyclopentene, cyclohexene and norbornene; or the like, and the like.

Examples of the aromatic hydrocarbon group having a valency of k and having 6 to 20 carbon atoms include groups obtained by eliminating k hydrogen atoms from: arenes such as benzene, toluene, naphthalene and anthracene; alkylarenes such as toluene, ethylbenzene and methylnaphthalene; or the like, and the like.

Examples of the hetero atom included in the divalent and monovalent hetero atom-containing groups include an oxygen atom, a nitrogen atom, a sulfur atom, a phosphorus atom, and the like.

Examples of the divalent hetero atom-containing group include —O—, —NH—, —S—, —CO—, —CS—, groups obtained by combining at least two of these, and the like.

Examples of the monovalent hetero atom-containing group include a hydroxy group, an amino group, a cyano group, a nitro group, and the like.

$R^3$ represents preferably a single bond, a hydrocarbon group, a fluorinated hydrocarbon group or an aliphatic heterocyclic group, more preferably, provided that m is 1, a single bond, an alkanediyl group, a cycloalkanediyl group, an arenediyl group, an arenediylalkanediyl group, or an aliphatic heterocyclic group that includes an oxygen atom, and still more preferably a single bond, a propanediyl group, a cyclohexanediyl group, a cyclohexylethanediyl group, a benzenediyl group, a benzenediylethanediyl group, a hexafluoropropanediylcyclohexanediyl group or a norbornanelactone-diylcarbonyloxy group.

$R^{3'}$ represents preferably a single bond or a hydrocarbon group, more preferably a chain hydrocarbon group, and provided that n is 1, still more preferably a methanediyl group.

Examples of the monovalent fluorinated hydrocarbon group having 1 to 20 carbon atoms which may be represented by Rf include: monovalent fluorinated chain hydrocarbon groups having 1 to 20 carbon atoms such as a fluoromethyl group, a difluoromethyl group, a trifluoromethyl group, a trifluoroethyl group, a pentafluoro-n-propyl group and a hexafluoro-i-propyl group; monovalent fluorinated alicyclic hydrocarbon groups having 3 to 20 carbon atoms such as a difluorocyclopentyl group, a decafluorocyclohexyl group and a difluoronorbornyl group; monovalent fluorinated aromatic hydrocarbon groups having 6 to 20 carbon atoms such as a fluorophenyl group, a trifluorophenyl group, a pentafluorophenyl group and a trifluoronaphthyl group; and the like.

Examples of the monovalent hydroxy-substituted fluorinated hydrocarbon group having 1 to 20 carbon atoms which may be represented by Rf include: hydroxy-substituted fluorinated chain hydrocarbon groups having 1 to 20 carbon atoms such as a hydroxydi(trifluoromethyl)methyl group, a hydroxydi(trifluoromethyl)ethyl group, a hydroxydi(trifluoromethyl)propyl group and a hydroxydi(trifluoromethyl)butyl group; hydroxy-substituted fluorinated alicyclic hydrocarbon groups having 3 to 20 carbon atoms such as a hydroxytetrafluorocyclopentyl group and a hydroxytetrafluorocyclohexyl group; hydroxy-substituted fluorinated aromatic hydrocarbon groups having 6 to 20 carbon atoms such as a hydroxyphenyldifluoromethyl group; and the like.

Examples of the monovalent alkylcarbonyl-substituted fluorinated hydrocarbon group having 1 to 20 carbon atoms which may be which may be represented by Rf include: alkylcarbonyl-substituted fluorinated chain hydrocarbon groups having 1 to 20 carbon atoms such as a methylcarbonyldifluoromethyl group and a t-butylcarbonylhexafluoropropyl group; alkylcarbonyl-substituted fluorinated alicyclic hydrocarbon groups having 3 to 20 carbon atoms such as a methylcarbonyldifluorocyclohexyl group and a t-butylcarbonylhexafluorocyclohexyl group; alkylcarbonyl-substituted fluorinated aromatic hydrocarbon groups having 6 to 20 carbon atoms such as a methylcarbonyldifluorophenyl group and a t-butylcarbonyltetrafluorophenyl group; and the like.

Examples of the monovalent alkoxycarbonyl-substituted fluorinated hydrocarbon group having 1 to 20 carbon atoms which may be represented by Rf include alkoxycarbonyl-substituted fluorinated chain hydrocarbon groups having 1 to 20 carbon atoms such as a methoxycarbonyldifluoromethyl group and a t-butoxycarbonylhexafluoropropyl group; alkoxycarbonyl-substituted fluorinated alicyclic hydrocarbon groups having 3 to 20 carbon atoms such as a methoxycarbonyldifluorocyclohexyl group and a t-butoxycarbonylhexafluorocyclohexyl group; alkoxycarbonyl-substituted fluorinated aromatic hydrocarbon groups having 6 to 20 carbon atoms such as a methoxycarbonyldifluorophenyl group and a t-butoxycarbonyltetrafluorophenyl group; and the like.

Examples of the monovalent alkoxycarbonyloxy-substituted fluorinated hydrocarbon group having 1 to 20 carbon atoms which may be represented by Rf include: alkoxycarbonyloxy-substituted fluorinated chain hydrocarbon groups having 1 to 20 carbon atoms such as a methoxycarbonyloxydifluoromethyl group and a t-butoxycarbonyloxyhexafluoropropyl group; alkoxycarbonyloxy-substituted fluorinated alicyclic hydrocarbon groups having 3 to 20 carbon atoms such as a methoxycarbonyloxydifluorocyclohexyl group and a t-butoxycarbonyloxyhexafluorocyclohexyl group; alkoxycarbonyloxy-substituted fluorinated aromatic hydrocarbon groups having 6 to 20 carbon atoms such as a methoxycarbonyloxydifluorophenyl group and a t-butoxycarbonyloxytetrafluorophenyl group; and the like.

Examples of the monovalent hydroxy-substituted fluorinated hydrocarbon group having 1 to 20 carbon atoms which may be represented by Rf include groups represented by the following formula (i), and the like.

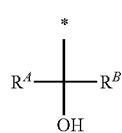

(i)

In the above formula (i), $R^A$ and $R^B$ each independently represent a hydrogen atom, a fluorine atom, an alkyl group having 1 to 8 carbon atoms or a fluorinated alkyl group having 1 to 8 carbon atoms, wherein at least either one of $R^A$ or $R^B$ represents a fluorine atom or a fluorinated alkyl group having 1 to 8 carbon atoms; and * denotes a binding site to other atom constituting the polymer.

Of these, Rf represents preferably a hydroxy-substituted fluorinated chain hydrocarbon group, more preferably the group represented by the above formula (i), and still more preferably a hydroxydi(trifluoromethyl)methyl group.

In the above formula, m is preferably 1 or 2, and more preferably 1. In the above formula, n is preferably 1.

Examples of the structural unit (I-1) include structural units represented by the following formulae, and the like.

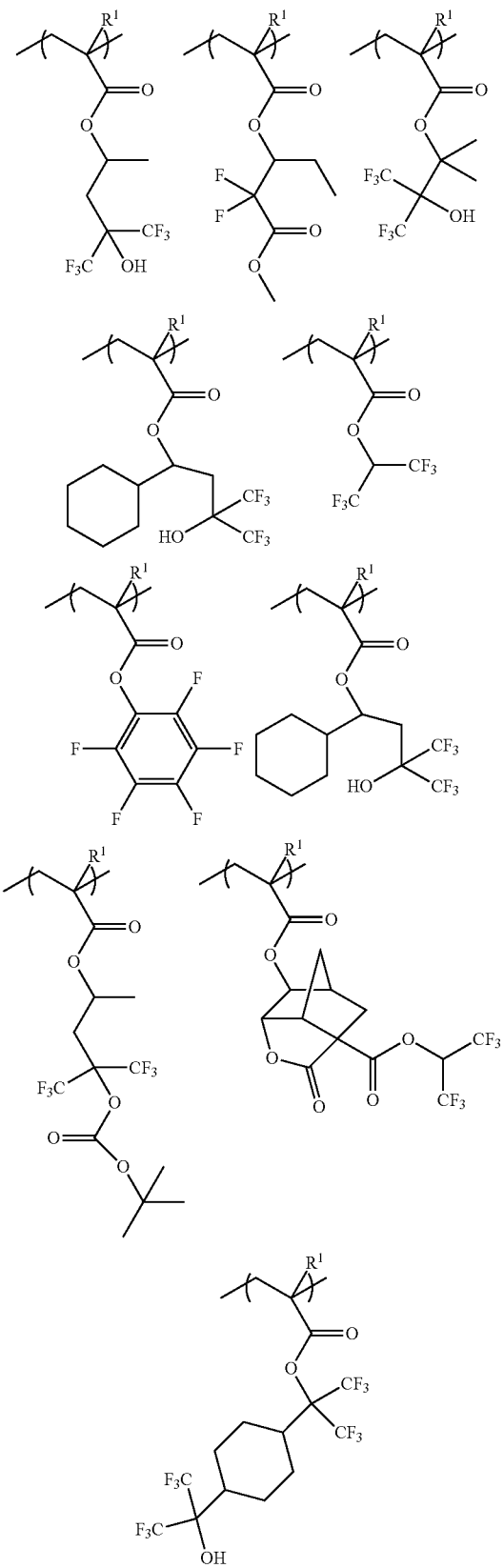

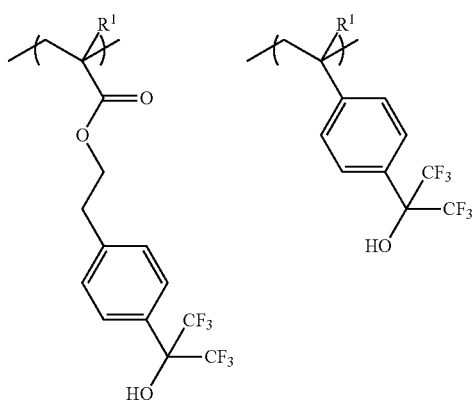

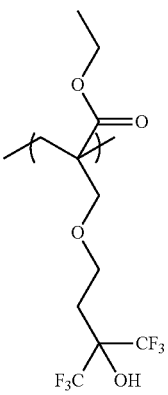

In the above formulae, R¹ is as defined in the above formula (1-1).

Examples of the structural unit (I-2) include structural units represented by the following formulae, and the like.

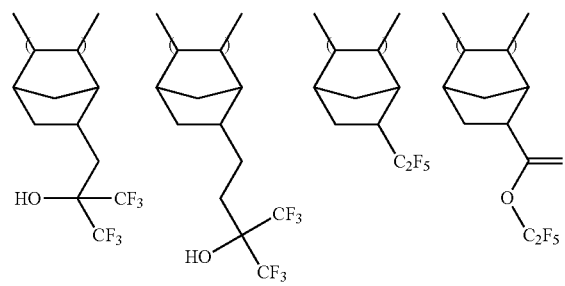

Examples of the structural unit (II) include structural units represented by the following formula (2) (hereinafter, may be also referred to as "structural unit (II-1)"), and the like.

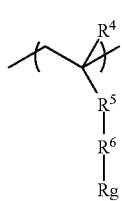

(2)

In the above formula (2), $R^4$ represents a hydrogen atom, a fluorine atom, a methyl group or —COOR″, wherein R″ represents a monovalent hydrocarbon group having 1 to 20 carbon atoms; $R^5$ represents a single bond, —O—, —CO—, —COO— or —CONH—; $R^6$ represents a single bond or a divalent organic group having 1 to 20 carbon atoms; and Rg represents a silicon atom-containing group having 1 to 20 silicon atoms.

Example of the divalent organic group having 1 to 20 carbon atoms which may be represented by $R^6$ include groups similar to those exemplified as $R^3$ in the above formula (1-1), wherein m is 1, and the like.

Examples of the structural unit (II-1) include structural units represented by the following formulae, and the like.

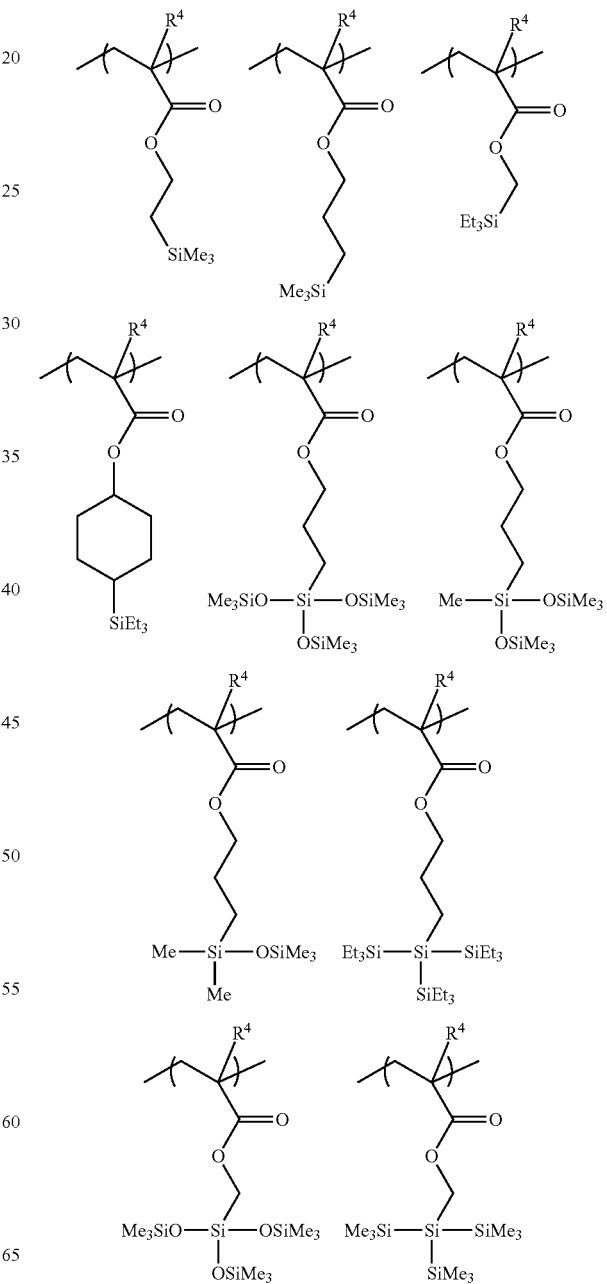

-continued

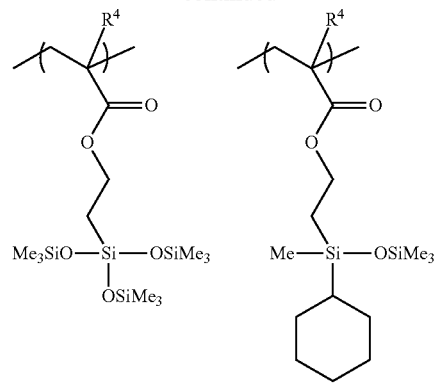
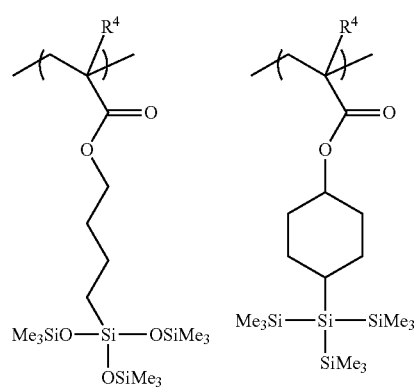
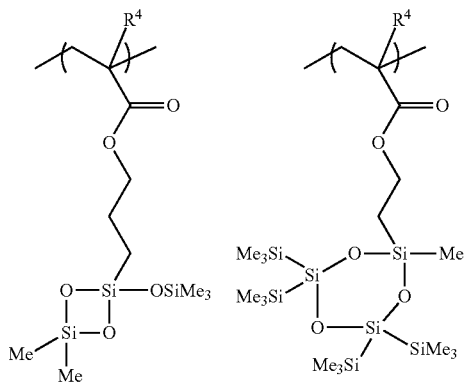
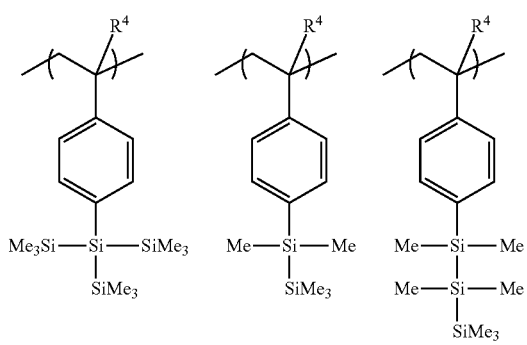

-continued

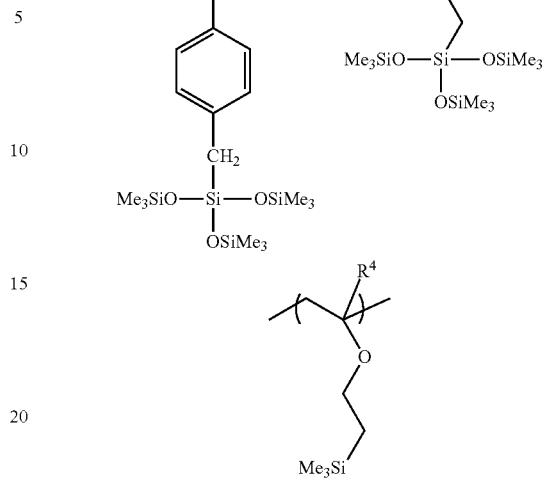

The lower limit of the proportion of the structural unit (I) contained is preferably 10 mol %, more preferably 50 mol %, still more preferably 90 mol %, and particularly preferably 95 mol % with respect to the total structural units constituting the polymer (B). The upper limit of the proportion of the structural unit (I) contained is preferably 100 mol %.

The lower limit of the proportion of the structural unit (II) is preferably 10 mol %, more preferably 20 mol %, and still more preferably 30 mol % with respect to the total structural units constituting the polymer (B). The upper limit of the proportion of the structural unit (II) contained is preferably 100 mol %, more preferably 70 mol %, and still more preferably 50 mol %.

The lower limit of the total proportion of the structural unit (I) and the structural unit (II) contained is preferably 30 mol %, more preferably 60 mol %, still more preferably 90 mol %, and particularly preferably 95 mol % with respect to the total structural units constituting the polymer (B). The upper limit of the total proportion of the structural unit (I) and the structural unit (II) is preferably 100 mol %.

When the proportion of the structural unit (I) and the structural unit (II) contained falls within the above range, removability of the film can be further improved.

The lower limit of the percentage content of fluorine atoms of the polymer (B) is preferably 1% by mass, more preferably 5% by mass, still more preferably 10% by mass, and particularly preferably 20% by mass. The upper limit of the percentage content of fluorine atoms is preferably 60% by mass, more preferably 50% by mass, and still more preferably 40% by mass.

The lower limit of the percentage content of silicon atoms of the polymer (B) is preferably 1% by mass, more preferably 5% by mass, still more preferably 10% by mass, and particularly preferably 15% by mass. The upper limit of the percentage content of silicon atoms is preferably 40% by mass, more preferably 30% by mass, and still more preferably 25% by mass.

The lower limit of the total percentage content fluorine atoms and silicon atoms of the polymer (B) is preferably 2% by mass, more preferably 8% by mass, still more preferably 15% by mass, and particularly preferably 25% by mass. The upper limit of the total percentage content is preferably 65% by mass, more preferably 55% by mass, and still more preferably 45% by mass.

When the percentage content of fluorine atoms and silicon atoms falls within the above range, removability of the film can be further improved.

It is to be noted that the percentage content of fluorine atoms and the percentage content of silicon atoms of the polymer (B) may be calculated based on the structure of the polymer determined by $^{19}$F-NMR or $^{29}$Si-NMR spectroscopy.

The polymer (B) may further have a structural unit that includes a β-diketone structure, a structural unit that includes a carboxy group, a structural unit that includes a sulfo group, a structural unit that includes a sulfonamide group, a structural unit derived from alkyl (meth)acrylate, a structural unit that includes a monocyclic or polycyclic lactone skeleton, a structural unit that includes a hydroxy group, a structural unit that includes an aromatic ring, a structural unit that includes an acid-labile group, and the like.

The proportion of the structural unit that includes a sulfo group contained in the polymer (B) is preferably no greater than 3 mol %, more preferably no greater than 2 mol %, and still more preferably no greater than 1 mol % with respect to the total structural units constituting the polymer (B). When the proportion is no greater than the upper limit, film removability in cleaning a silicon nitride substrate can be further improved.

The polymer (B) is preferably a copolymer. By using a copolymer, particle removability can be further improved.

The acid dissociation constant of the polymer (B) is preferably smaller than the acid dissociation constant of the organic acid (C) as described later. When the acid dissociation constant of the polymer (B) is smaller than that of the organic acid (C), removability of the film from the substrate surface can be further enhanced. The acid dissociation constant of the polymer (B) and the organic acid (C) may be determined by a well-known titration method. In evaluation of a relative magnitude of the acid dissociation constant, the relative magnitude may be determined from values calculated using a chemical computation software as a more convenient method, rather than the titration method. For example, a program available from ChemAxon may be used for the computation.

The lower limit of the content of the polymer (B) in the cleaning composition is preferably 0.1% by mass, more preferably 0.5% by mass, and still more preferably 1% by mass. The upper limit of the content is preferably 50% by mass, more preferably 30% by mass, and still more preferably 15% by mass. When the content falls within the range of from the lower limit to the upper limit, removability of the film from the substrate surface can be further enhanced.

The lower limit of the content of the polymer (B) with respect to the total solid content in the cleaning composition is preferably 30% by mass, more preferably 40% by mass, and still more preferably 50% by mass. The upper limit of the content of the polymer (B) is preferably 99% by mass, more preferably 98% by mass, and still more preferably 96% by mass. When the content falls within the range of from the lower limit to the upper limit, removability of the film from the substrate surface can be further enhanced.

(C) Organic Acid

The organic acid (C) is an organic acid which is a non-polymeric acid (i.e., not belonging to polymers). The cleaning composition according to the embodiment of the present invention may further contain the organic acid (C). Addition of the organic acid (C) further facilitates the removal of the film formed on the substrate surface. The upper limit of the molecular weight of the organic acid (C) is, for example, 500, preferably 400, and more preferably 300. The lower limit of the molecular weight of the organic acid (C) is, for example, 50, and preferably 55.

Examples of the organic acid (C) include monocarboxylic acid compounds, e.g.:

monocarboxylic acids such as acetic acid, propionic acid, butanoic acid, pentanoic acid, hexanoic acid, cyclohexanecarboxylic acid, cyclohexylacetic acid, 1-adamantanecarboxylic acid, benzoic acid and phenylacetic acid;

fluorine atom-containing monocarboxylic acids such as difluoroacetic acid, trifluoroacetic acid, pentafluoropropanoic acid, heptafluorobutanoic acid, fluorophenylacetic acid and difluorobenzoic acid;

hetero atom-containing monocarboxylic acids such as 10-hydroxydecanoic acid, thiolacetic acid, 5-oxohexanoic acid, 3-methoxycyclohexanecarboxylic acid, camphorcarboxylic acid, dinitrobenzoic acid, nitrophenylacetic acid, lactic acid, glycolic acid, glyceric acid, salicylic acid, anisic acid, gallic acid and furancarboxylic acid; and double bond-containing monocarboxylic acids such as (meth)acrylic acid, crotonic acid and cinnamic acid, as well as polycarboxylic acid compounds, e.g.:

polycarboxylic acids such as oxalic acid, malonic acid, succinic acid, glutaric acid, adipic acid, dodecanedicarboxylic acid, propanetricarboxylic acid, butanetetracarboxylic acid, hexafluoroglutaric acid, cyclohexanehexacarboxylic acid, 1,4-naphthalenedicarboxylic acid, phthalic acid, isophthalic acid, terephthalic acid, trimellitic acid and pyromellitic acid;

partially esterified products of the polycarboxylic acids;

fluorine atom-containing polycarboxylic acids such as difluoromalonic acid and tetrafluorophthalic acid;

hetero atom-containing polycarboxylic acids such as tartaric acid, citric acid, malic acid, tartronic acid, diglycolic acid and iminodiacetic acid;

double bond-containing polycarboxylic acids such as maleic acid and fumaric acid, and the like.

The lower limit of the solubility of the organic acid (C) in water at 25° C. is preferably 5% by mass, more preferably 7% by mass, and still more preferably 10% by mass. The upper limit of the solubility is preferably 50% by mass, more preferably 40% by mass, and still more preferably 30% by mass. When the solubility falls within the range of from the lower limit to the upper limit, the removal of the film formed can be further facilitated.

The organic acid (C) is preferably a solid at 25° C. When the organic acid (C) is a solid at 25° C., it is presumed that the organic acid (C) in a solid state will be deposited in the film formed from the cleaning composition, whereby the removability is further improved.

The organic acid (C) is, in light of the removal of the film to be further facilitated, preferably a polyhydric carboxylic acid, and more preferably oxalic acid, malic acid or citric acid.

The lower limit of the content of the organic acid (C) in the cleaning composition is preferably 0.01% by mass, more preferably 0.05% by mass, and still more preferably 0.1% by mass. The upper limit of the content of the organic acid (C) is preferably 30% by mass, more preferably 20% by mass, and still more preferably 10% by mass.

The lower limit of the content of the organic acid (C) with respect to the total solid content in the cleaning composition is preferably 0.5% by mass, more preferably 1% by mass, and still more preferably 3% by mass. The upper limit of the content of the organic acid (C) is preferably 30% by mass, more preferably 20% by mass, and still more preferably 10% by mass.

When the content of the organic acid (C) falls within the range of from the lower limit to the upper limit, the removal of the film can be further facilitated.

Other Optional Component

The cleaning composition may contain other optional component in addition to the components (A) to (C). The other optional component is exemplified by a surfactant, and the like.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, and the like.

The content of the surfactant is typically no greater than 2% by mass, and preferably no greater than 1% by mass.

Cleaning Method of Semiconductor Substrate

A cleaning method for a semiconductor substrate carried out using the cleaning composition includes the steps of coating the cleaning composition on the semiconductor substrate surface (hereinafter, may be also referred to as "coating step"), and removing the formed film (hereinafter, may be also referred to as "removing step"). By forming the film on the substrate surface using the cleaning composition, unwanted substances on the substrate surface can be efficiently removed. Furthermore, the formed film can be easily removed from the substrate surface. Thus, the cleaning composition described above can be applied to substrates formed from a variety of materials. Examples of the substrate which can be applied include metal or metalloid substrates such as silicon substrates, aluminum substrates, nickel substrates, chromium substrates, molybdenum substrates, tungsten substrates, copper substrates, tantalum substrates and titanium substrates; ceramic substrates such as silicon nitride substrate, alumina substrates, silicon dioxide substrates, tantalum nitride substrates and titanium nitride substrates; and the like. Of these, silicon substrates, silicon nitride substrates and titanium nitride substrates are preferred, and silicon nitride substrates are more preferred.

One example of the method of applying the cleaning composition according to the embodiment of the present invention to cleaning of a substrate is explained in more detail with reference to drawings.

Figure 1B:
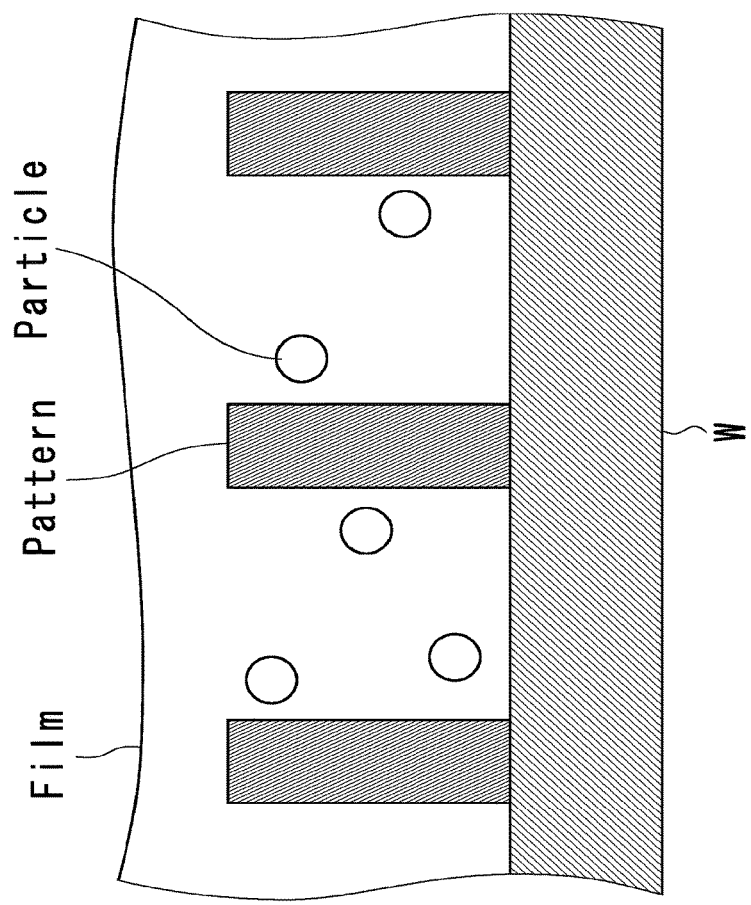
FIG. 1B shows an explanatory view illustrating the cleaning method for a semiconductor substrate carried out using the cleaning composition for a semiconductor substrate of the embodiment of the present invention.

As shown in FIG. 1A, in this application example, the aforementioned cleaning composition is used as a treatment liquid for forming a film on a wafer W. First, the cleaning composition is supplied on the wafer W. The supplying method may involve, for example, spin coating, cast coating, roll coating, and the like. Next, the supplied cleaning composition is subjected to heating and/or vacuum to remove a part or all of the solvent contained in the cleaning composition, whereby the solid content contained in the cleaning composition is solidified or hardened to form a film. The term "solidify" as referred to herein means to give a state of solid, and "harden" as referred to means to increase the molecular weight through linking of the molecules (by, for example, crosslinking, polymerization and the like). In this procedure, the particles attached to the pattern and the like are incorporated into the film and drawn away from the pattern and the like (see FIG. 1B). The thickness of the film formed is preferably 10 nm to 1,000 nm, and more preferably 20 nm to 500 nm.

Next, a removing liquid that dissolves the film is supplied onto the film, whereby the film is entirely removed from the wafer W. As a result, the particles are removed from the wafer W together with the film. As the removing liquid, water, an organic solvent, an aqueous alkaline solution or the like may be used, and the removing liquid is preferably water or an aqueous alkaline solution, and more preferably an aqueous alkaline solution. As the aqueous alkaline solution, an alkaline developer solution may be used, which may be a well-known alkaline developer solution. Specific examples of the alkaline developer solution include aqueous solutions containing at least one of ammonia, tetramethylammonium hydroxide (TMAH) and choline, and the like. As the organic solvent, for example, a thinner, isopropyl alcohol (IPA), 4-methyl-2-pentanol (MIBC), toluene, acetic acid esters, alcohols, glycols (propylene glycol monomethyl ether, etc.) or the like may be used. Also, the removal of the film may be carried out sequentially through using different types of the removing liquids, e.g., by supplying water as the removing liquid first on the film, and then supplying an alkaline developer solution. By sequentially using different types of the removing liquids, film removability can be further improved.

Figure 1C:
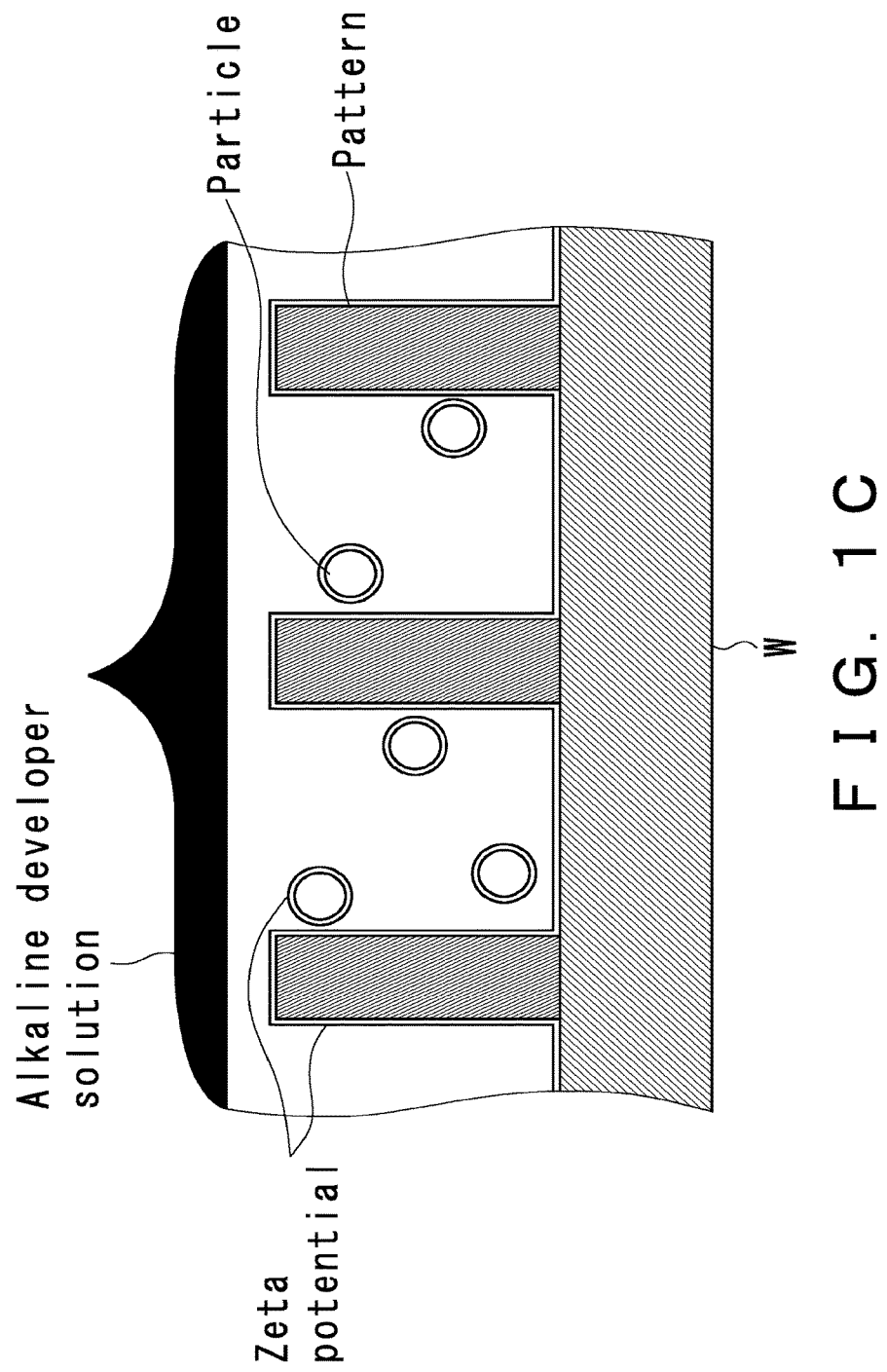
FIG. 1C shows an explanatory view illustrating the cleaning method for a semiconductor substrate carried out using the cleaning composition for a semiconductor substrate of the embodiment of the present invention.

When the removing liquid such as an alkaline developer solution or the like is supplied, zeta potentials having identical polarity (in this case, minus) are generated on the wafer W, the pattern surface and the particle surface, as shown in FIG. 1C. The particles drawn away from the wafer W and the like are charged with a zeta potential having identical polarity to that of the wafer W and the like, leading to resilience with the wafer W and the like. Accordingly, reattachment of the particle to the wafer W and the like can be prevented.

Thus, in the present application example, the particles can be removed with a weaker force as compared with conventional removal of the particles by way of physical force, and therefore, pattern collapse can be inhibited. In addition, since the particles are removed without utilizing a chemical action, erosion of the base film due to an etching action, etc., can be also inhibited. Furthermore, smaller particles, and particles embedded into gaps of the pattern can be also easily removed, which involve difficulty in the removal according to a cleaning method for substrates carried out using a physical force.

The cleaning composition supplied onto the wafer W is finally removed completely from the wafer W. Therefore, the wafer W after the cleaning will have a state as before coating the cleaning composition, more specifically, a state in which the circuit-forming face is exposed.

The cleaning method may be carried out using well-known various apparatuses and skill methods. A suitable apparatus is exemplified by an apparatus for cleaning a substrate disclosed in Japanese Unexamined Patent Application, Publication No. 2014-99583.

EXAMPLES

Hereinafter, Examples of the cleaning composition according to the embodiment of the present invention will be explained.

The weight average molecular weight (Mw) and the number average molecular weight (Mn) of a polymer obtained were determined by gel permeation chromatography (GPC) using GPC columns (G2000 HXL×2, G3000 HXL×1 and G4000 HXL×1) manufactured by Tosoh Corporation, a differential refractometer as a detector, and mono-dispersed polystyrene as a standard, under analytical conditions involving a flow rate of 1.0 mL/min, an elution solvent of tetrahydrofuran, a sample concentration of 1.0% by mass, an amount of an injected sample of 100 μL, and a column temperature of 40° C. In addition, the dispersity index (Mw/Mn) was calculated based on the results of the determination of the Mw and the Mn.

Synthesis of Polymers

Compounds used as materials of the polymers are shown below.

(M-1)
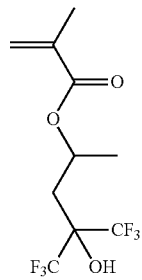

(M-2)
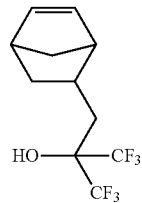

(M-3)
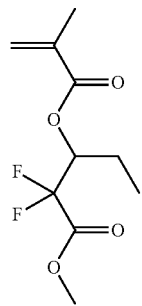

(M-4)
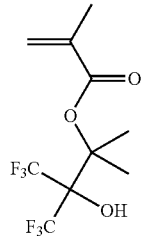

(M-5)
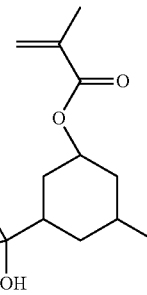

(M-6)
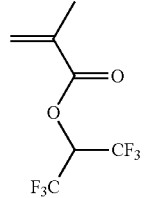

(M-7)
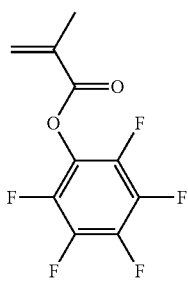

(M-8)
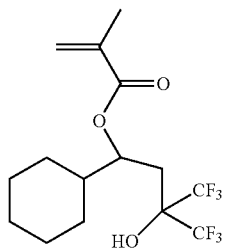

(M-9)
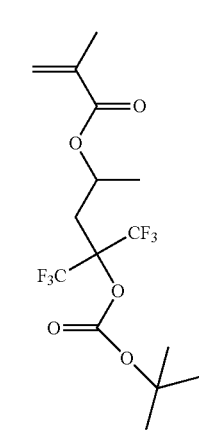

(M-10)
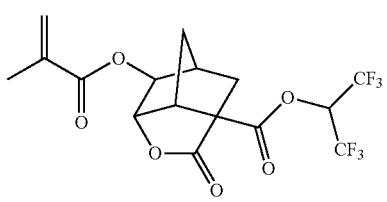

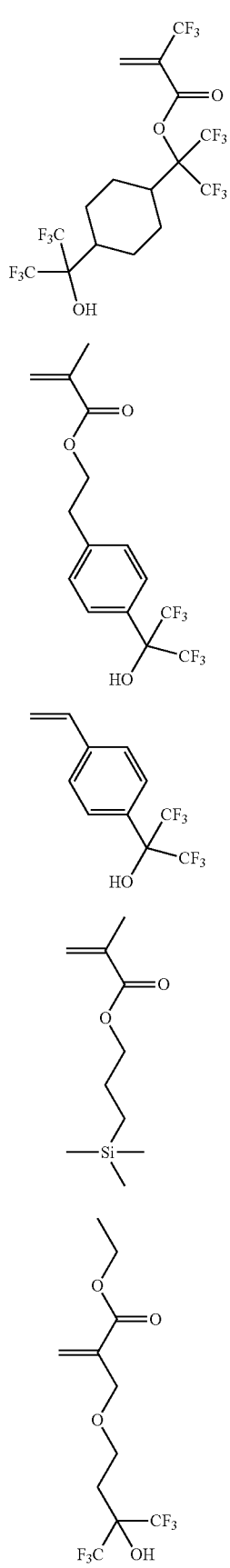

Production Example 1

A monomer solution was prepared in which 100 g (100 mol %) of the compound (M-1) and 7.29 g (7 mol %) of azobisisobutyronitrile (AIBN) were dissolved in 100 g of 2-butanone. A 1,000 mL three-neck flask charged with 100 g of 2-butanone was purged with nitrogen for 30 min. The nitrogen purge was followed by heating to 80° C., and the monomer solution was added dropwise with stirring over 3 hrs using a dropping funnel. The time of the start of the dropwise addition was regarded as the time of the start of the polymerization reaction, and the polymerization was allowed for 6 hrs. After completing the polymerization, the reaction solution was cooled to no greater than 30° C. The reaction solution was concentrated in vacuo to give a mass of 150 g, and thereto were charged 150 g of methanol and 750 g of n-hexane to permit separation. After the separation, the underlayer liquid was recovered. To the recovered underlayer liquid was charged 750 g of n-hexane, and again purified through separation. After the separation, the underlayer liquid was recovered. The solvent was removed from the underlayer liquid recovered, and 4-methyl-2-pentanol was added thereto to give a solution containing a polymer (P-1). The results are shown in Table 1.

Production Examples 2 to 22

Polymers (P-2) to (P-22) were synthesized in a similar manner to Production Example 1 except that the compound used and the combination were changed as shown in Table 1.

(HDPE) (pore size: 5 nm, PhotoKleen EZD, manufactured by Japan Pall Corporation). A decrease of the particles having a diameter of no greater than 150 μm in the liquid to 10 particles/mL was ascertained by Liquid-Borne Particle Sensor (KS-41B, manufactured by Rion Co., Ltd.), and thus a cleaning composition (D-1) was prepared. The solid content concentration was about 1.5% by mass.

Examples 2 to 30 and Comparative Examples 1 and 2

Cleaning compositions (D-2) to (D-30) and comparative compositions (CD-1) and (CD-2) were prepared in a similar manner to Example 1 except that the solvent and the polymer were each changed as shown in Tables 2-1 and 2-2.

Example 31

The polymer (P-1) in an amount of 100 parts by mass, 5.0 parts by mass of tartaric acid (C-1) as an organic acid, and 7,400 parts by mass of 4-methyl-2-pentanol as a solvent were mixed to prepare a homogenous solution. This solution was filtered through a filter made of high density polyethylene (HDPE) (pore size: 5 nm, PhotoKleen EZD, manufactured by Japan Pall Corporation). A decrease of the particles having a diameter of no greater than 150 μm in the liquid to 10 particles/mL was ascertained by Liquid-Borne Particle Sensor (KS-41B, manufactured by Rion Co., Ltd.), and thus a cleaning composition (D-31) was prepared. The solid content concentration was about 1.5% by mass.

TABLE 1

|  | Polymer | Monomer type | composition ratio (mol %) | Yield (%) | Weight average molecular weight (Mw) | Dispersity index (Mw/Mn) |
|---|---|---|---|---|---|---|
| Production Example 1 | P-1 | M-1 | 100 | 80 | 10,500 | 1.52 |
| Production Example 2 | P-2 | M-2 | 100 | 79 | 10,400 | 1.51 |
| Production Example 3 | P-3 | M-3 | 100 | 80 | 10,000 | 1.55 |
| Production Example 4 | P-4 | M-4/M-5 | 70/30 | 80 | 10,520 | 1.53 |
| Production Example 5 | P-5 | M-1/M-6 | 90/10 | 81 | 9,900 | 1.50 |
| Production Example 6 | P-6 | M-4/M-6 | 80/20 | 78 | 10,200 | 1.51 |
| Production Example 7 | P-7 | M-6/M-8 | 50/50 | 79 | 10,450 | 1.52 |
| Production Example 8 | P-8 | M-3/M-6 | 70/30 | 82 | 10,000 | 1.52 |
| Production Example 9 | P-9 | M-1/M-9 | 50/50 | 84 | 7,400 | 1.35 |
| Production Example 10 | P-10 | M-1/M-10 | 60/40 | 83 | 10,300 | 1.52 |
| Production Example 11 | P-11 | M-6/M-11 | 40/60 | 78 | 11,000 | 1.51 |
| Production Example 12 | P-12 | M-6/M-12 | 40/60 | 82 | 9,800 | 1.50 |
| Production Example 13 | P-13 | M-6/M-13 | 40/60 | 83 | 9,500 | 1.53 |
| Production Example 14 | P-14 | M-1/M-14 | 60/40 | 82 | 9,900 | 1.52 |
| Production Example 15 | P-15 | M-6/M-15 | 60/40 | 81 | 10,300 | 1.55 |
| Production Example 16 | P-16 | M-1/M-16 | 98/2 | 77 | 10,250 | 1.54 |
| Production Example 17 | P-17 | M-6/M-16 | 98/2 | 76 | 11,000 | 1.53 |
| Production Example 18 | P-18 | M-3/M-16 | 98/2 | 78 | 9,900 | 1.52 |
| Production Example 19 | P-19 | M-1/M-17 | 98/2 | 79 | 10,500 | 1.51 |
| Production Example 20 | P-20 | M-6/M-17 | 98/2 | 81 | 11,200 | 1.51 |
| Production Example 21 | P-21 | M-18/M-19 | 50/50 | 84 | 7,400 | 1.35 |
| Production Example 22 | P-22 | M-20/M-21/M-22 | 30/40/30 | 90 | 80,000 | 1.85 |

Preparation of Cleaning Composition for Semiconductor Substrate

Example 1

The polymer (P-1) in an amount of 100 parts by mass, and 7,400 parts by mass of 4-methyl-2-pentanol (MIBC) were mixed to prepare a homogenous solution. This solution was filtered through a filter made of high density polyethylene

Examples 32 to 38 and Comparative Examples 3 to 6

Cleaning compositions (D-32) to (D-38), and comparative compositions (CD-3) to (CD-6) were prepared in a similar manner to Example 31 except that the solvent, the polymer and the organic acid were changed as shown in Tables 2-1 and 2-2, with the total mass of the solvent being identical to that of Example 31.

TABLE 2-1

| | Solvent | | Organic acid | |
|---|---|---|---|---|
| | Cleaning composition | (mass ratio shown in the parentheses) | Polymer type | content (parts by mass) |
| Example 1 | D-1 | MIBC | P-1 | — — |
| Example 2 | D-2 | MIBC | P-2 | — — |
| Example 3 | D-3 | MIBC | P-3 | — — |
| Example 4 | D-4 | MIBC | P-4 | — — |
| Example 5 | D-5 | MIBC | P-5 | — — |
| Example 6 | D-6 | MIBC | P-6 | — — |
| Example 7 | D-7 | MIBC | P-7 | — — |
| Example 8 | D-8 | MIBC | P-8 | — — |
| Example 9 | D-9 | MIBC | P-9 | — — |
| Example 10 | D-10 | MIBC | P-10 | — — |
| Example 11 | D-11 | MIBC | P-11 | — — |
| Example 12 | D-12 | MIBC | P-12 | — — |
| Example 13 | D-13 | MIBC | P-13 | — — |
| Example 14 | D-14 | MIBC | P-14 | — — |
| Example 15 | D-15 | MIBC | P-15 | — — |
| Example 16 | D-16 | MIBC | P-16 | — — |
| Example 17 | D-17 | MIBC | P-17 | — — |
| Example 18 | D-18 | MIBC | P-18 | — — |
| Example 19 | D-19 | MIBC | P-19 | — — |
| Example 20 | D-20 | MIBC | P-20 | — — |
| Example 21 | D-21 | MIBC/PGME (70/30) | P-9 | — — |
| Example 22 | D-22 | MIBC/DIAE (40/60) | P-9 | — — |

TABLE 2-2

| | Solvent | | Organic acid | |
|---|---|---|---|---|
| | Cleaning composition | (mass ratio shown in the parentheses) | Polymer type | content (parts by mass) |
| Example 23 | D-23 | MIBC/GBL (95/5) | P-9 | — — |
| Example 24 | D-24 | EL | P-9 | — — |
| Example 25 | D-25 | PGMEA | P-9 | — — |
| Example 26 | D-26 | PGMEA/PGME (70/30) | P-9 | — — |
| Example 27 | D-27 | PGMEA/CHN (70/30) | P-9 | — — |
| Example 28 | D-28 | PGMEA/BuOAc (95/5) | P-9 | — — |
| Example 29 | D-29 | PGEE | P-9 | — — |
| Example 30 | D-30 | MMP | P-9 | — — |
| Example 31 | D-31 | MIBC | P-1 | C-1 5 |
| Example 32 | D-32 | MIBC | P-2 | C-2 5 |
| Example 33 | D-33 | MIBC | P-3 | C-3 5 |
| Example 34 | D-34 | MIBC | P-4 | C-4 5 |
| Example 35 | D-35 | MIBC | P-5 | C-5 5 |
| Example 36 | D-36 | MIBC | P-6 | C-6 5 |
| Example 37 | D-37 | MIBC | P-7 | C-7 5 |
| Example 38 | D-38 | MIBC | P-8 | C-8 5 |
| Comparative Example 1 | CD-1 | MIBC | P-21 | — — |
| Comparative Example 2 | CD-2 | MIBC | P-22 | — — |
| Comparative Example 3 | CD-3 | MIBC | P-21 | C-1 5 |
| Comparative Example 4 | CD-4 | MIBC | P-21 | C-9 5 |
| Comparative Example 5 | CD-5 | MIBC | P-22 | C-2 5 |
| Comparative Example 6 | CD-6 | PGMEA/PGME (70/30) | P-21 | C-10 5 |

The solvents used in each Example and Comparative Example are as in the following.
MIBC: 4-methyl-2-pentanol
PGME: propylene glycol monomethyl ether
DIAE: diisoamyl ether
GBL: γ-butyrolactone
PGMEA: propylene glycol monomethyl ether acetate
EL: ethyl lactate
CHN: cyclohexanone
BuOAc: butyl acetate
PGEE: propylene glycol monoethyl ether
MMP: methyl 3-methoxypropionate The organic acids used in each Example and Comparative Example are as in the following. In the present Examples, any of the organic acid used was a reagent manufactured by Wako Pure Chemical Industries, Ltd.

The structure formulae are shown below.
C-1: tartaric acid
C-2: oxalic acid
C-3: citric acid
C-4: maleic acid
C-5: malic acid
C-6: fumaric acid
C-7: phthalic acid
C-8: terephthalic acid
C-9: polyacrylic acid (manufactured by Wako Pure Chemical Industries, Ltd., Polyacrylic Acid 5000)
C-10: triphenylsulfonium nonafluoro-n-butanesulfonate

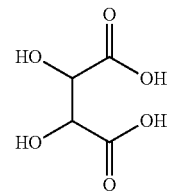

(C-1)

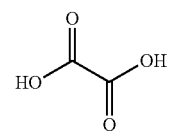

(C-2)

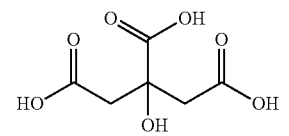

(C-3)

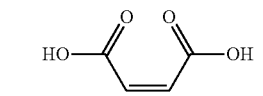

(C-4)

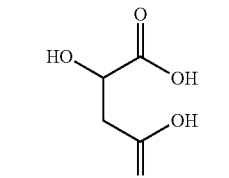

(C-5)

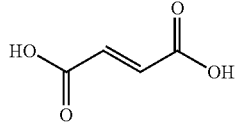

(C-6)

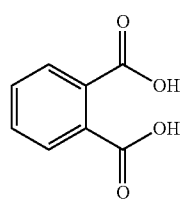

(C-7)

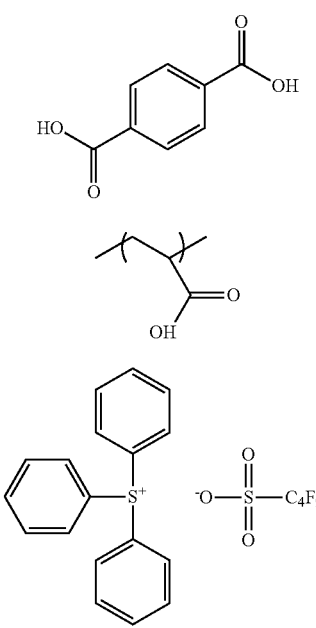

(C-8)

(C-9)

(C-10)

Evaluation of Particle Removability and Film Removability

On a 12-inch wafer on which silica particles having a diameter of 200 nm had been previously attached, a resin film of each composition was provided by a spin coating method by using the aforementioned apparatus for cleaning a substrate. The removing liquid was supplied on the resin film thus provided, and the resin film was removed. The film removability was decided to be: "A" when removal of the entire resin film was completed within 20 sec from the starting time point of the supply of the removing liquid; "B" when the removal was completed later than 20 sec and within 1 min; and "C" when the removal was not completed within 1 min. Furthermore, the number of silica particles left on the wafer after the removing step was analyzed using a defect inspection system in the dark field (Wafer Surface Inspection System, SP2, manufactured by KLA-TENCOR Corporation). The particle removability was decided to be: "S" when the removal rate of the silica particles was no less than 90%; "A" when the removal rate was no less than 70% and less than 90%; "B" when the removal rate was no less than 30% and less than 70%; and "C" when the removal rate was less than 30%. In the case in which the formation of the resin film failed, the column of the particle removability was filled with an expression of "coating failed".

Evaluation Examples 1 to 45 and Comparative Evaluation Examples 1 to 7

Using a silicon wafer as a wafer, the compositions (D-1) to (D-38) and the comparative compositions (CD-1) to (CD-6) as the cleaning composition, the developer solution (2.38% by mass aqueous tetramethylammonium hydroxide solution) or water shown in Tables 3-1 to 3-3 as a removing liquid, respectively, the particle removability and the film removability were evaluated according to the evaluation method described above. The results are shown in Tables 3-1 to 3-3.

TABLE 3-1

| | Cleaning composition | Removing liquid | Particle removability | Film removability |
|---|---|---|---|---|
| Evaluation Example 1 | D-1 | developer solution | A | A |
| Evaluation Example 2 | D-2 | developer solution | A | A |
| Evaluation Example 3 | D-3 | developer solution | B | A |
| Evaluation Example 4 | D-4 | developer solution | S | A |
| Evaluation Example 5 | D-4 | water | S | B |
| Evaluation Example 6 | D-5 | developer solution | S | B |
| Evaluation Example 7 | D-5 | water | S | B |
| Evaluation Example 8 | D-6 | developer solution | A | B |
| Evaluation Example 9 | D-7 | developer solution | S | B |
| Evaluation Example 10 | D-8 | developer solution | B | B |
| Evaluation Example 11 | D-9 | developer solution | S | B |
| Evaluation Example 12 | D-10 | developer solution | A | B |
| Evaluation Example 13 | D-11 | developer solution | S | B |
| Evaluation Example 14 | D-12 | developer solution | A | B |
| Evaluation Example 15 | D-13 | developer solution | A | B |
| Evaluation Example 16 | D-14 | developer solution | A | B |
| Evaluation Example 17 | D-15 | developer solution | S | B |
| Evaluation Example 18 | D-16 | developer solution | A | A |
| Evaluation Example 19 | D-17 | developer solution | A | A |
| Evaluation Example 20 | D-18 | developer solution | A | A |
| Evaluation Example 21 | D-19 | developer solution | A | A |
| Evaluation Example 22 | D-20 | developer solution | A | A |
| Evaluation Example 23 | D-21 | developer solution | A | B |
| Evaluation Example 24 | D-22 | developer solution | A | B |
| Evaluation Example 25 | D-23 | developer solution | A | B |

TABLE 3-2

| | Cleaning composition | Removing liquid | Particle removability | Film removability |
|---|---|---|---|---|
| Evaluation Example 26 | D-24 | developer solution | A | B |
| Evaluation Example 27 | D-25 | developer solution | A | B |
| Evaluation Example 28 | D-26 | developer solution | A | B |
| Evaluation Example 29 | D-27 | developer solution | A | B |
| Evaluation Example 30 | D-28 | developer solution | A | B |

TABLE 3-2-continued

| | Cleaning composition | Removing liquid | Particle removability | Film removability |
|---|---|---|---|---|
| Evaluation Example 31 | D-29 | developer solution | A | B |
| Evaluation Example 32 | D-30 | developer solution | A | B |
| Evaluation Example 33 | D-31 | developer solution | S | A |
| Evaluation Example 34 | D-32 | developer solution | S | A |
| Evaluation Example 35 | D-33 | developer solution | S | A |
| Evaluation Example 36 | D-34 | developer solution | S | A |
| Evaluation Example 37 | D-34 | water | S | A |
| Evaluation Example 38 | D-35 | developer solution | S | A |
| Evaluation Example 39 | D-35 | water | S | A |
| Evaluation Example 40 | D-36 | developer solution | S | A |
| Evaluation Example 41 | D-36 | water | S | A |
| Evaluation Example 42 | D-37 | developer solution | S | A |
| Evaluation Example 43 | D-37 | water | S | A |
| Evaluation Example 44 | D-38 | developer solution | S | A |
| Evaluation Example 45 | D-38 | water | S | A |

TABLE 3-3

| | Cleaning composition | Removing liquid | Particle removability | Film removability |
|---|---|---|---|---|
| Comparative Evaluation Example 1 | CD-1 | developer solution | C | C |
| Comparative Evaluation Example 2 | CD-2 | developer solution | C | C |
| Comparative Evaluation Example 3 | CD-3 | developer solution | C | C |
| Comparative Evaluation Example 4 | CD-3 | water | C | C |
| Comparative Evaluation Example 5 | CD-4 | developer solution | coating failed | coating failed |
| Comparative Evaluation Example 6 | CD-5 | developer solution | C | C |
| Comparative Evaluation Example 7 | CD-6 | developer solution | C | C |

Evaluation Examples 46 to 58 and Comparative Evaluation Examples 8 to 10

In a similar manner to that described above except that the silicon wafer was changed to silicon nitride or titanium nitride, and that the combination of the cleaning composition used with the removing liquid was changed as shown in Table 4, the particle removability and the film removability were evaluated. The results are shown in Table 4.

TABLE 4

| | Cleaning composition | Removing liquid | Wafer material particle removability | | Wafer material film removability | |
|---|---|---|---|---|---|---|
| | | | SiN | TiN | SiN | TiN |
| Evaluation Example 46 | D-31 | developer solution | S | S | A | A |
| Evaluation Example 47 | D-32 | developer solution | S | S | A | A |
| Evaluation Example 48 | D-33 | developer solution | S | S | A | A |
| Evaluation Example 49 | D-34 | developer solution | S | S | A | A |
| Evaluation Example 50 | D-34 | water | S | S | B | B |
| Evaluation Example 51 | D-35 | developer solution | S | S | B | B |
| Evaluation Example 52 | D-35 | water | S | S | B | B |
| Evaluation Example 53 | D-36 | developer solution | S | S | B | B |
| Evaluation Example 54 | D-36 | water | S | S | B | B |
| Evaluation Example 55 | D-37 | developer solution | S | S | B | B |
| Evaluation Example 56 | D-37 | water | S | S | B | B |
| Evaluation Example 57 | D-38 | developer solution | S | S | B | B |
| Evaluation Example 58 | D-38 | water | S | S | B | B |
| Comparative Evaluation Example 8 | CD-3 | developer solution | C | C | C | C |
| Comparative Evaluation Example 9 | CD-3 | water | C | C | C | C |

TABLE 4-continued

| | Cleaning composition | Removing liquid | Wafer material | | | |
| --- | --- | --- | --- | --- | --- | --- |
| | | | particle removability | | film removability | |
| | | | SiN | TiN | SiN | TiN |
| Comparative Evaluation Example 10 | CD-4 | developer solution | coating failed | coating failed | coating failed | coating failed |

A comparison of each Evaluation Example with each Comparative Evaluation Example reveals that the cleaning composition according to the embodiment of the present invention is superior in both the particle removability and the film removability in the cleaning method for a substrate which includes providing a film on the substrate surface, and removing the same. In addition, a comparison of Evaluation Examples 4 to 7 with Evaluation Examples 36 to 39 reveals that an addition of the organic acid further improves the film removability when water was used as the removing liquid, in particular.

According to the cleaning composition for a semiconductor substrate of the embodiment of the present invention, in processes of removing unwanted substances on the substrate surface through forming a film on the substrate surface, the cleaning composition for a semiconductor substrate is capable of efficiently removing particles on the substrate surface, and enables the formed film to be easily removed from the substrate surface. The cleaning composition for a semiconductor substrate can be suitably used in production of semiconductor substrates in which further progress of miniaturization, and an increase of the aspect ratio are expected in the future.

Obviously, numerous modifications and variations of the present invention are possible in light of the above teachings. It is therefore to be understood that within the scope of the appended claims, the invention may be practiced otherwise than as specifically described herein.

The invention claimed is:
1. A cleaning composition comprising:
a solvent;
a polyhydric carboxylic acid; and
a polymer comprising a fluorine atom or a combination of fluorine and silicon atoms, and comprising a structural unit represented by formula (1-1), a structural unit represented by formula (1-2), or a combination thereof,

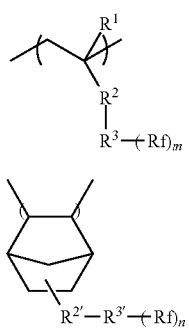

wherein, in the formulae (1-1) and (1-2), each Rf independently represents a monovalent fluorinated hydrocarbon group having 1 to 20 carbon atoms, the monovalent fluorinated hydrocarbon group comprising a group represented by formula (i), and in a case where Rf is present in a plurality of number, a plurality of Rfs are identical or different, in the formula (1-1), m is an integer of 1 to 3; $R^1$ represents a hydrogen atom, a fluorine atom, a methyl group or —COOR'; R' represents a monovalent hydrocarbon group having 1 to 20 carbon atoms; $R^2$ represents a single bond, —O—, —CO—, —COO— or —CONH—; and in a case of m is 1, $R^3$ represents a single bond, a divalent organic group having 1 to 20 carbon atoms, and in the case where m is 2 or 3, $R^3$ represents an organic group having 1 to 20 carbon atoms and having a valency of (m+1), and in the formula (1-2), n is an integer of 1 to 3; $R^{2'}$ represents a single bond, —O—, —COO— or —CONH—; and in a case where n is 1, $R^{3'}$ represents a single bond or a divalent organic group having 1 to 20 carbon atoms, and in a case where n is 2 or 3, $R^{3'}$ represents an organic group having 1 to 20 carbon atoms and having a valency of (n+1),

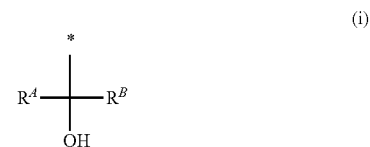

wherein in the formula (i), $R^A$ and $R^B$ each independently represent a hydrogen atom, a fluorine atom, an alkyl group having 1 to 8 carbon atoms or a fluorinated alkyl group having 1 to 8 carbon atoms, wherein at least either one of $R^A$ or $R^B$ represents a fluorine atom or a fluorinated alkyl group having 1 to 8 carbon atoms; and * denotes a binding site to an atom of the polymer, wherein when the polymer comprises a structural unit comprising a silicon atom, the structural unit comprising a silicon is at least one structural unit selected from the group consisting of:

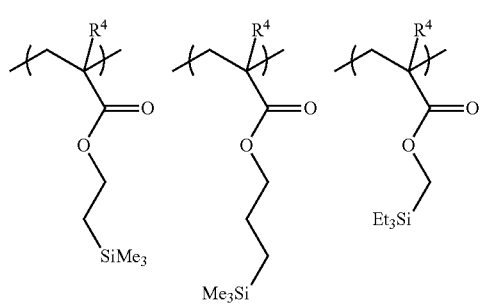

-continued

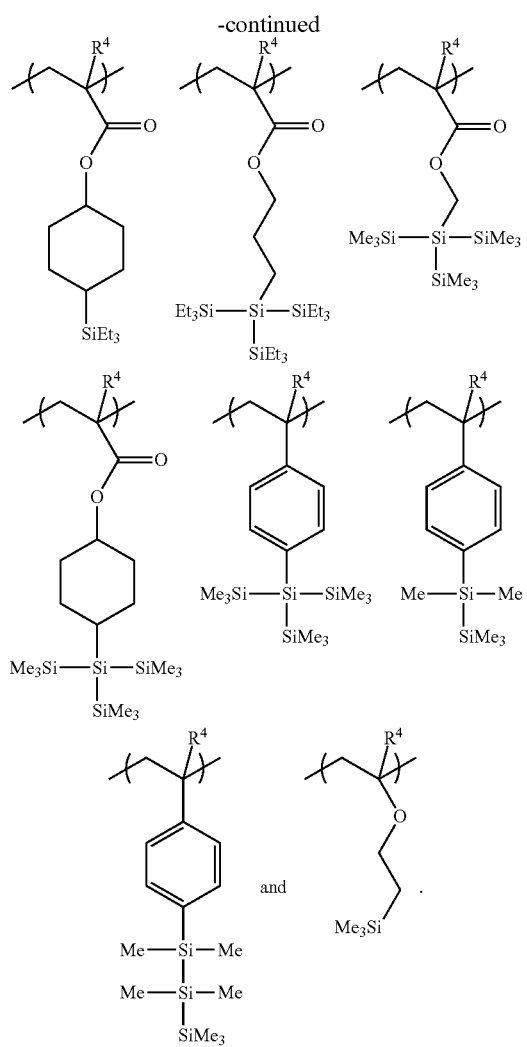

2. The cleaning composition according to claim 1, wherein a content of water in the solvent is no greater than 20% by mass.

3. The cleaning composition according to claim 1, wherein the polymer does not comprise an acid group, or the polymer comprises an acid group and an acid dissociation constant of the polymer is smaller than an acid dissociation constant of the polyhydric carboxylic acid.

4. The cleaning composition according to claim 1, wherein a solubility of the polyhydric carboxylic acid in water at 25° C. is no less than 5% by mass.

5. The cleaning composition according to claim 1, wherein the polyhydric carboxylic acid is a solid at 25° C.

6. The cleaning composition according to claim 1, wherein a total content of the fluorine atom and the silicon atom in the polymer is 15% by mass or more, and
a content of the polymer with respect to a total solid content in the cleaning composition is 30% by mass or more.

7. The cleaning composition according to claim 1, wherein a content of the polyhydric carboxylic acid in the cleaning composition is 0.05% by mass or more.

8. The cleaning composition according to claim 1, wherein a content of the polyhydric carboxylic acid in the cleaning composition is 0.1% by mass or more.

9. The cleaning composition according to claim 1, wherein a content of the polyhydric carboxylic acid with respect to a total solid content in the cleaning composition is 30% by mass or less.

10. The cleaning composition according to claim 1, wherein a content of the polyhydric carboxylic acid with respect to a total solid content in the cleaning composition is 10% by mass or less.

11. The cleaning composition according to claim 1, wherein the polyhydric carboxylic acid is at least one selected from the group consisting of oxalic acid, malic acid and citric acid.

12. The cleaning composition according to claim 1, wherein a content of the polymer with respect to a total solid content in the cleaning composition is preferably 50% by mass or more.

13. The cleaning composition according to claim 1, wherein a molecular weight of the polyhydric carboxylic acid is 300 or less.

14. The cleaning composition according to claim 1, wherein a content of water in the solvent is no greater than 2% by mass.

15. The cleaning composition according to claim 1, wherein the solvent does not contain water.

16. The cleaning composition according to claim 1, wherein content of the solvent in the cleaning composition is from 80% by mass to 99.5% by mass.

17. The cleaning composition according to claim 1, wherein content of the solvent in the cleaning composition is from 90% by mass to 99.0% by mass.

* * * * *